United States Patent [19]

Fujiwara

[11] Patent Number: 5,292,395
[45] Date of Patent: Mar. 8, 1994

[54] ECR PLASMA REACTION APPARATUS HAVING UNIFORM MAGNETIC FIELD GRADIENT

[75] Inventor: Nobuo Fujiwara, Itami, Japan

[73] Assignee: Mitsubishi Denki Kabushiki Kaisha, Tokyo, Japan

[21] Appl. No.: 885,603

[22] Filed: May 19, 1992

[30] Foreign Application Priority Data

May 21, 1991 [JP] Japan .................. 3-115909

[51] Int. Cl.$^5$ .......................................... H01L 21/00
[52] U.S. Cl. .......................... 156/345; 18/723 MR; 18/723 MA
[58] Field of Search ....... 118/723, 723 MR, 723 MA; 156/345; 204/298.38, 298.37; 315/111.21, 111.41; 335/268; 336/147, 150

[56] References Cited

U.S. PATENT DOCUMENTS

| 4,438,368 | 3/1984 | Abe et al. ................ 315/39 |
| 4,877,509 | 10/1989 | Ogawa et al. .............. 204/298 |
| 4,952,273 | 8/1990 | Popov ................ 204/298.37 X |
| 4,982,138 | 1/1991 | Fujiwara et al. .......... 315/111.41 |

FOREIGN PATENT DOCUMENTS

| 63-38585 | 2/1988 | Japan . |
| 64-8624 | 1/1989 | Japan . |
| 1-212758 | 8/1989 | Japan ........................ 118/723 |
| 2-68900 | 3/1990 | Japan . |
| 2-73981 | 3/1990 | Japan ...................... 204/298.37 |
| 278730 | 11/1990 | Japan ...................... 315/111.21 |
| 4-41674 | 2/1992 | Japan ........................ 118/723 |
| 273741 | 7/1988 | United Kingdom . |

OTHER PUBLICATIONS

Fujiwara et al, "High Performance Electron Cyclotron Resonance Plasma Etching With Control Of Magnetic Field Gradient", Japanese Journal of Applied Physics, vol. 30, No. 11B, Nov. 1991, pp. 3142-3146.

Samukawa et al, "Extremely high-selective electron cyclotron resonance plasma etching for phosphorus-doped polycrystalline silicon", Applied Physics Letters, vol. 57, No. 4, Jul. 1990.

Primary Examiner—Brian E. Hearn
Assistant Examiner—Jonathan D. Baskin
Attorney, Agent, or Firm—Leydig, Voit & Mayer

[57] ABSTRACT

A plasma reaction apparatus has main and auxiliary magnetic field generating coils for generating a magnetic field which has a gradient of no more than 50 gauss/cm in the axial direction and a difference between the axial magnetic field gradient and the magnetic field gradient ten centimeters from the axis of no more than 10 gauss/cm for processing a semiconductor substrate. The plasma reaction apparatus is able to generate a high density, uniform plasma so that the semiconductor substrate is uniformly processed at high speed.

9 Claims, 6 Drawing Sheets

ECR PLASMA REACTION APPARATUS HAVING UNIFORM MAGNETIC FIELD GRADIENT

BACKGROUND OF THE INVENTION

1. Field of the Invention

The present invention relates to a plasma reaction apparatus, and, more particularly, to a plasma reaction apparatus for etching the surface of a semiconductor substrate with a gas discharge.

2. Description of the Related Art

When a semiconductor device is manufactured, the semiconductor substrate is subjected to processes such as a thin film forming process and an etching process. A semiconductor substrate processing apparatus, may generate a plasma in a gas discharge.

FIG. 5 is a schematic cross sectional view which illustrates an ordinary conventional plasma reaction apparatus 100 in which a plasma is generated by ECR (Electron Cyclotron Resource) discharge.

Referring to FIG. 5, the plasma reaction apparatus 100 comprises a reaction chamber 1, and a waveguide tube 6 for introducing microwaves into the reaction chamber 1, a quartz plate 7 serving as an introduction port through which the microwaves are introduced. A single solenoid coil 4 serving as a magnetic field generating means and a mirror coil 5 are disposed outside the reaction chamber 1, the single solenoid coil 4 surrounding the reaction chamber 1. A gas introduction port 8 is formed in the upper portion of the reaction chamber 1 and an exhaust port 13 is formed in the bottom portion of the reaction chamber 1. Furthermore, the reaction chamber 1 includes a supporting frame 3 on which a semiconductor substrate 2 is placed.

The thus structured apparatus is operated as follows. The inside portion of the reaction chamber 1 is exhausted by means of a vacuum pump (omitted from illustration) through the exhaust port 13. Then, a reactive gas is introduced into the reaction chamber 1 through the gas introduction port 8, and a portion of the reactive gas is exhausted through the exhaust port 13 while continuing the gas introduction into the reaction chamber 1 so as to make the gas pressure constant. Furthermore, microwaves having a frequency of 2.45 GHz and generated by a microwave power source (omitted from illustration) are introduced into the reaction chamber 1 via the waveguide tube 6 and the quarts plate 7. On the other hand, electricity is supplied to the single solenoid coil 4 disposed around the reaction chamber 1 so as to cause the solenoid coil 4 to generate a magnetic field for exciting ECR, that is a magnetic field having a magnetic flux density of 875 gauss in the reaction chamber 1. Also the mirror coil 5 is supplied with electricity so that it generates a magnetic field in the same direction as that generated by the solenoid coil 4. As a result, a weak mirror magnetic field is created between the solenoid coil 4 and the mirror coil 5 so that magnetic lines of force are perpendicular to the surface of the semiconductor substrate 2.

As a result of the above-mentioned operation, reactive gas molecules in the reaction chamber 1 are formed into a plasma due to collisions with electrons accelerated by the ECR. The reactive gas plasma thus generated is dispersed along the magnetic lines of force so that the dispersed reactive gas plasma is perpendicularly incident on the surface of the semiconductor substrate 2 on the supporting frame 3. At this time, the surface of the semiconductor substrate 2 is etched in a desired direction. The type and the pressure of the gas, and the microwave power and the like are determined according to the process to which the semiconductor substrate 2 to be processed is subjected.

In the plasma reaction apparatus 100 utilizing the ECR discharge, the resonance region is not widely and uniformly formed because the magnetic field required for the electron cyclotron resonance is generated by the single solenoid coil 4. That is, it has been difficult to obtain an etching apparatus revealing a high etching rate and satisfactory uniformity. The reason for this will now be described with reference to FIG. 6 which is a graph showing the relationship between solenoid electric current values and etch rates while also referring to uniformity data.

When the electric current supplied to the solenoid coil 4 is small, that is, about 160A as shown in FIG. 7, the gradient of the magnetic field is small in the ECR region in the vicinity of the center of the reaction chamber 1 and the gradient of the magnetic field increases in proportion to the distance from the center. Therefore, a non-uniform resonance region distribution is (as will be described later with reference to FIG. 7) displayed as follows: the resonance region is distributed widely in the center portion of the reaction chamber 1 and narrowed in inverse proportion to the distance from the center as shown by the diagionally-lined area 11 in FIG. 5. On the other hand, in a case where the value of the electric current supplied to the solenoid coil 4 is large, that is, about 190A,. a uniform ECR region is formed as shown by the diagonally-lined area 12 in FIG. 5 because the gradient of the magnetic field in the ECR region is great (as will be described later with reference to FIG. 7). However, the uniform magnetic field has been too narrow and therefore only a narrow resonant region has been formed.

Results of experiments carried out by using the conventional plasma reaction apparatus will now be described with reference to FIGS. 6 and 7.

The specifications of the coil used in the experiment are as follows: the inner diameter was 27 cm, the outer diameter was 39 cm, the axial directional length was 14 cm and the number of turns was 160. An Si-substrate having a diameter of 6 inches was etched by a plasma generated under conditions that the flow rate of chlorine gas was 10 cc/minute, the pressure was 0.5 mTorr and the microwave power was 600 W.

According to the magnetic field characteristics shown in FIG. 7, the gradient of the magnetic field parallel to the axis of the magnetic field is small when an electric current having a small value is supplied to the coil. The value of the axial gradient along the central axis (R=0 cm) and at a point (R=10 cm) 10 cm distant from the central axis are considerably different from each other.

Since the magnetic field gradient and the area of the ECR region are in inverse proportional relationship, a wide ECR region is formed when the magnetic field gradient is small. As a result, the density of the generated plasma is increased. Therefore, the etch rate is raised in a case where the value of the electric current supplied to the coil is small as shown in FIG. 6.

Although it is preferable that the practical etch rate be 1000Å/min or higher, the uniformity of the magnetic field becomes worse, excessively so, to 20% or more, and the ECR region is distributed as shown by the diagonally-lined area 11 in FIG. 5 when the etch rate is increased. As a result, desired uniformity of etching on the semiconductor substrate 2 cannot be obtained.

On the other hand, if a uniform ECR region (represented by reference numeral 12 shown in FIG. 5) is desired (adjacent to the coil electric current of 190A shown in FIG. 6), the ECR region is narrowed and a practical etch rate of 1000Å/min cannot be obtained.

As described above, the conventional plasma reaction apparatus using ECR therefore encounters a problem that an increase in the etching speed and an improvement of the uniformity of the magnetic field cannot be realized simultaneously.

That is, as can be understood from the above description, the axial gradient of the magnetic field and the etch rate have a close relationship. Furthermore, the uniformity of the gradient of the magnetic field must be improved in order to improve the uniformity of the etch rate. The radial directional uniformity of the gradient of the magnetic field shown in FIG. 7 is calculated by the following equation 1 from the larger and the smaller of the gradients of the magnetic field in a region at a central axis (R=0) to the point of 10 cm distant from the central axis (R=10 cm):

Uniformity of the gradient of the magnetic field (%) =

$$\frac{\text{larger gradient} - \text{smaller gradient}}{\text{larger gradient} + \text{smaller gradient}} \times 100$$

As can be seen from a dashed curve shown in FIG. 7, increasing the electric current supplied to the coil improves the uniformity of the gradient of the magnetic field and coincides with an increase in the uniformity of the etch rate as shown in FIG. 6.

However, there arises a problem in that, if an enlarged electric current is supplied to the coil in order to improve the uniformity of the gradient of the axial magnetic field, the value of the gradient of the magnetic field is undesirably increased and therefore the etch rate deteriorates.

SUMMARY OF THE INVENTION

Accordingly, an object of the present invention is to overcome the above-mentioned problem and to provide a plasma reaction apparatus for generating a uniform high-density plasma and uniformly processing a semiconductor substrate at high speed.

In order to achieve the above object, there is provided a plasma reaction apparatus comprising: a reaction chamber for accomodating a semiconductor substrate; a waveguide tube for introducing microwaves into said reaction chamber; and magnetic field generating means disposed around said reaction chamber, wherein a magnetic field generated by said magnetic field generating means has a gradient of no more than 50 gauss/cm in the axial direction of said magnetic field generating means, the difference between the maximum value and the minimum value of said magnetic field gradient value is no more than 10 gauss/cm, electronic cyclotron resonance is excited by microwaves and said magnetic field and plasma is generated so that said semiconductor substrate is processed by said plasma.

DETAILED DESCRIPTION OF THE PREFERRED EMBODIMENTS

First Embodiment

A preferred embodiment of the present invention will now be described with reference to the drawings. Since the structure and the operation are the same as those of the apparatus shown in FIG. 5 except for some portions, only the different portions will now be described and the other portions are omitted from the description.

Figure 1:
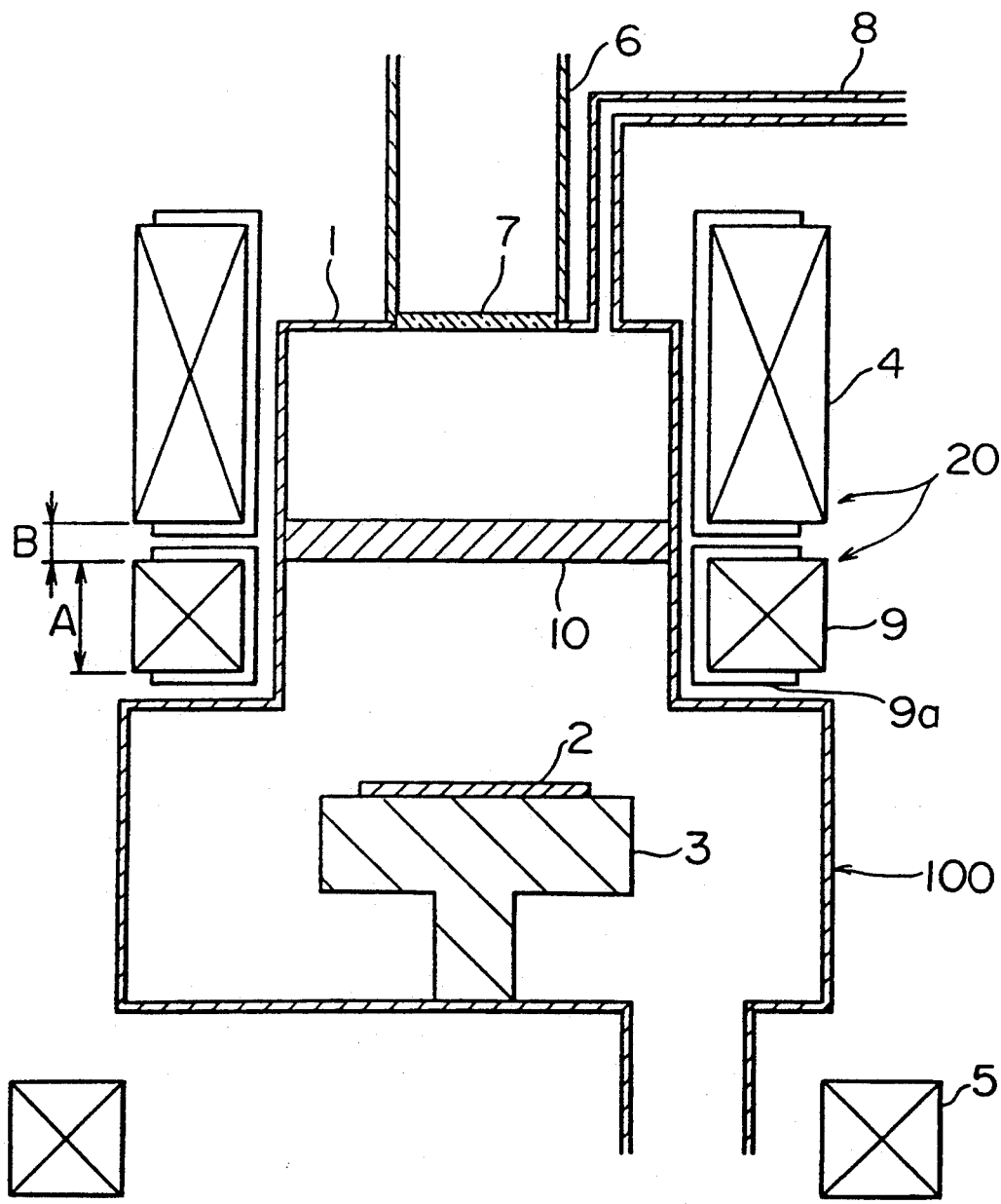
FIG. 1 is a cross sectional view which illustrates an embodiment of a plasma reaction apparatus according to the present invention.

FIG. 1 is a schematic cross sectional view which illustrates a first embodiment of a plasma reaction apparatus according to the present invention.

According to the first embodiment, a magnetic field generating means 20 has an auxiliary coil 9 spaced from a solenoid coil 4 by a distance corresponding to a gap B. Furthermore, the solenoid coil 4, the auxiliary coil 9 and the mirror coil 5 are arranged to receive electric currents independently.

According to the first embodiment, the electric current to be supplied to the solenoid coil 4 and that to be supplied to the auxiliary coil 9 are determined in order to form the ECR region at the position of the gap B. The electric currents supplied to the two coils pass in the same direction. According to the first embodiment, the same solenoid coil 4 provided for the conventional apparatus is used and an electric current of 140A is applied to it. The auxiliary coil 9 is disposed at a position spaced from the solenoid coil 4 by the gap B, which is determined to be 3 cm according to this embodiment. The specifications of the auxiliary coil 9 are as follows: the inner diameter of the coil is 27 cm, the outer diameter of the coil is 39 cm, the axial directional length is 6 cm and the number of turns is 54.

The operation of the plasma reaction apparatus according to the first embodiment will now be described.

Figure 5:
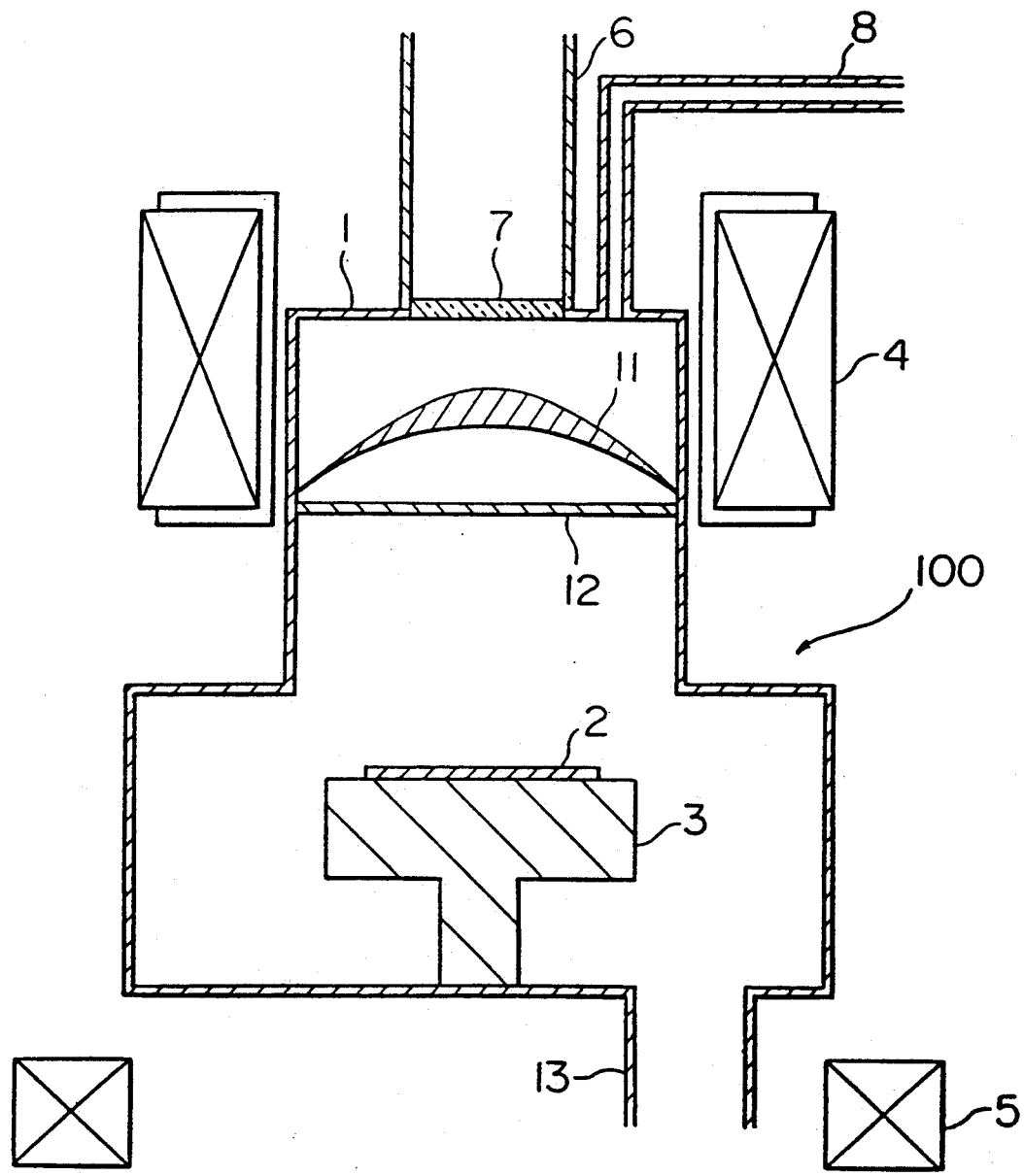
FIG. 5 is a cross sectional view which illustrates a conventional plasma reaction apparatus.
Figure 6:
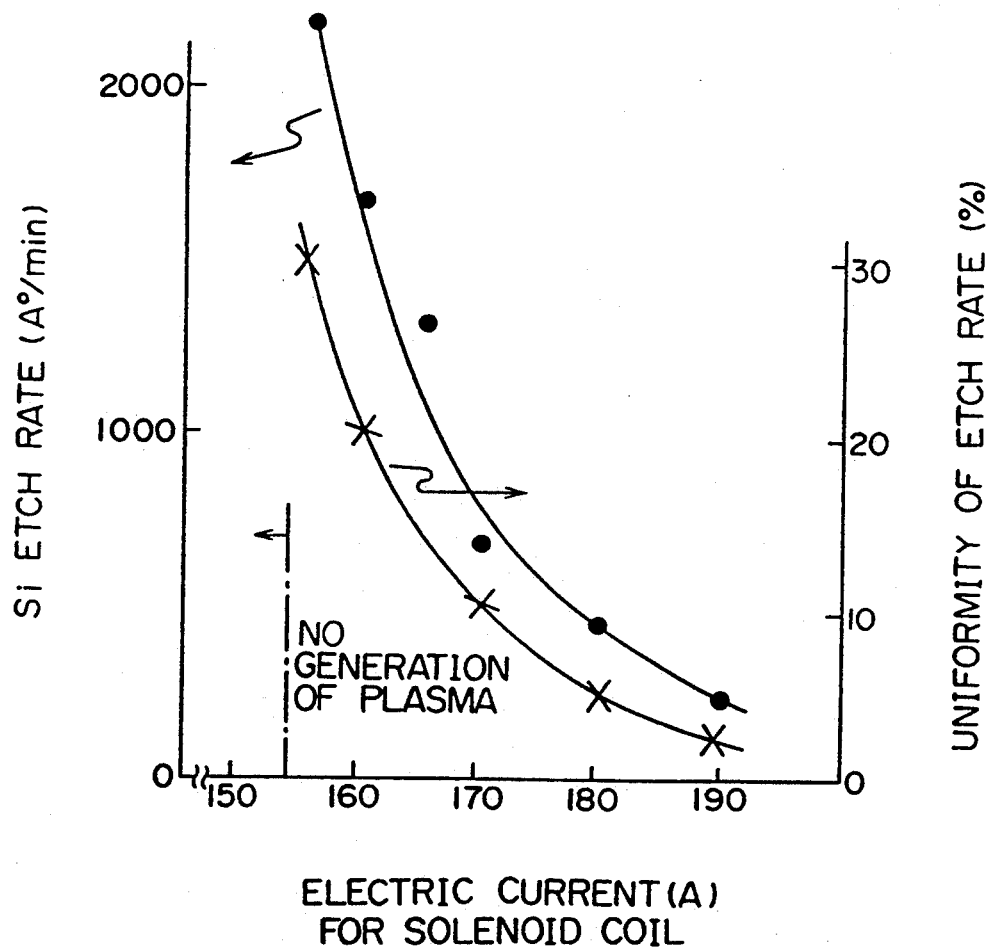
FIG. 6 illustrates the characteristics of the etching rate realized by a conventional plasma reaction apparatus.
Figure 7:
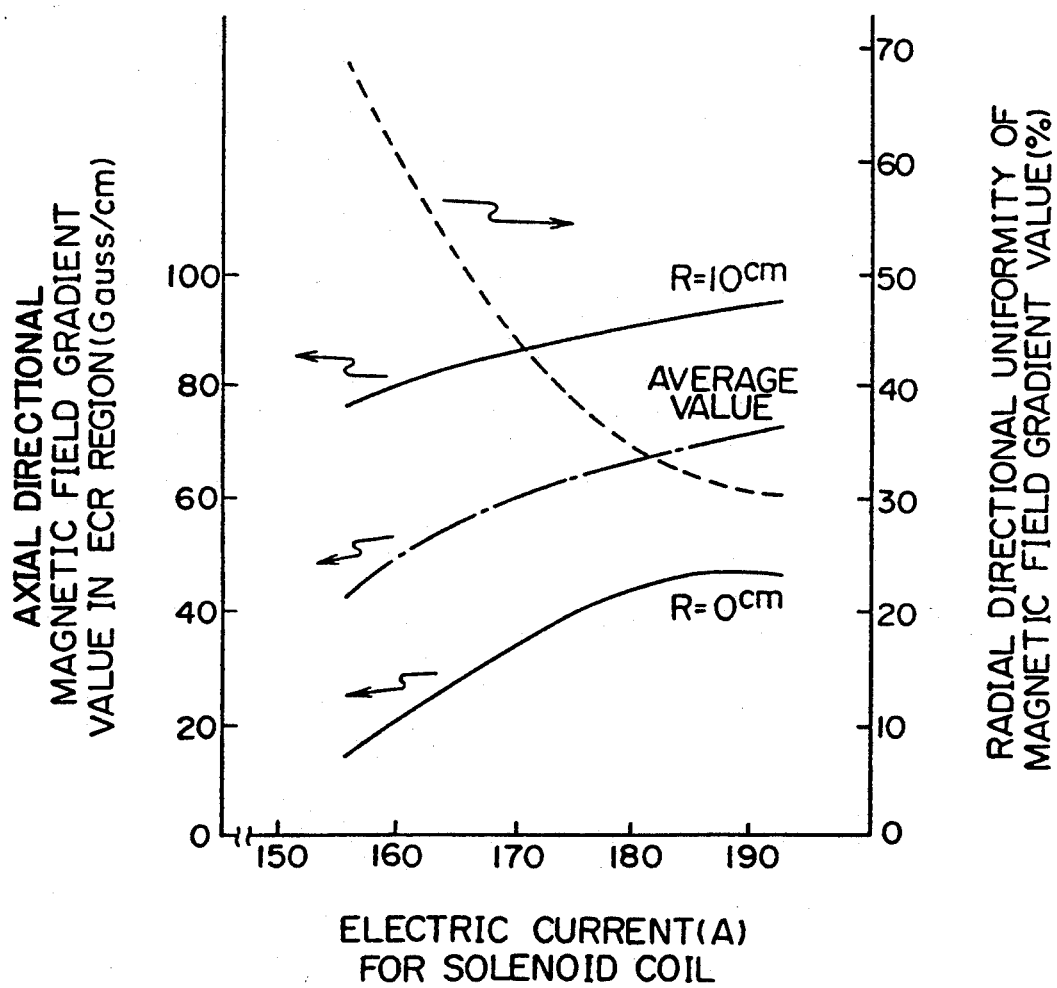
FIG. 7 illustrates the characteristics of the gradient of the magnetic field formed by the conventional plasma reaction apparatus.

When only the solenoid coil 4 is excited, a magnetic, field is formed which produces a wide resonance region but which lacks uniformity as designated by reference numeral 11 in the conventional structure shown in FIG. 5.

When the exciting electric current supplied to the auxiliary coil 9 is increased and the above-mentioned magnetic field is formed, the presence of the gap B will cause a weak mirror magnetic field to be generated between the solenoid coil 4 and the auxiliary coil 9. The aforesaid effect first becomes apparent in the peripheral portion of the reaction chamber 1, and then it gradually affects the central portion and the ECR region is gradually widened.

Figure 2:
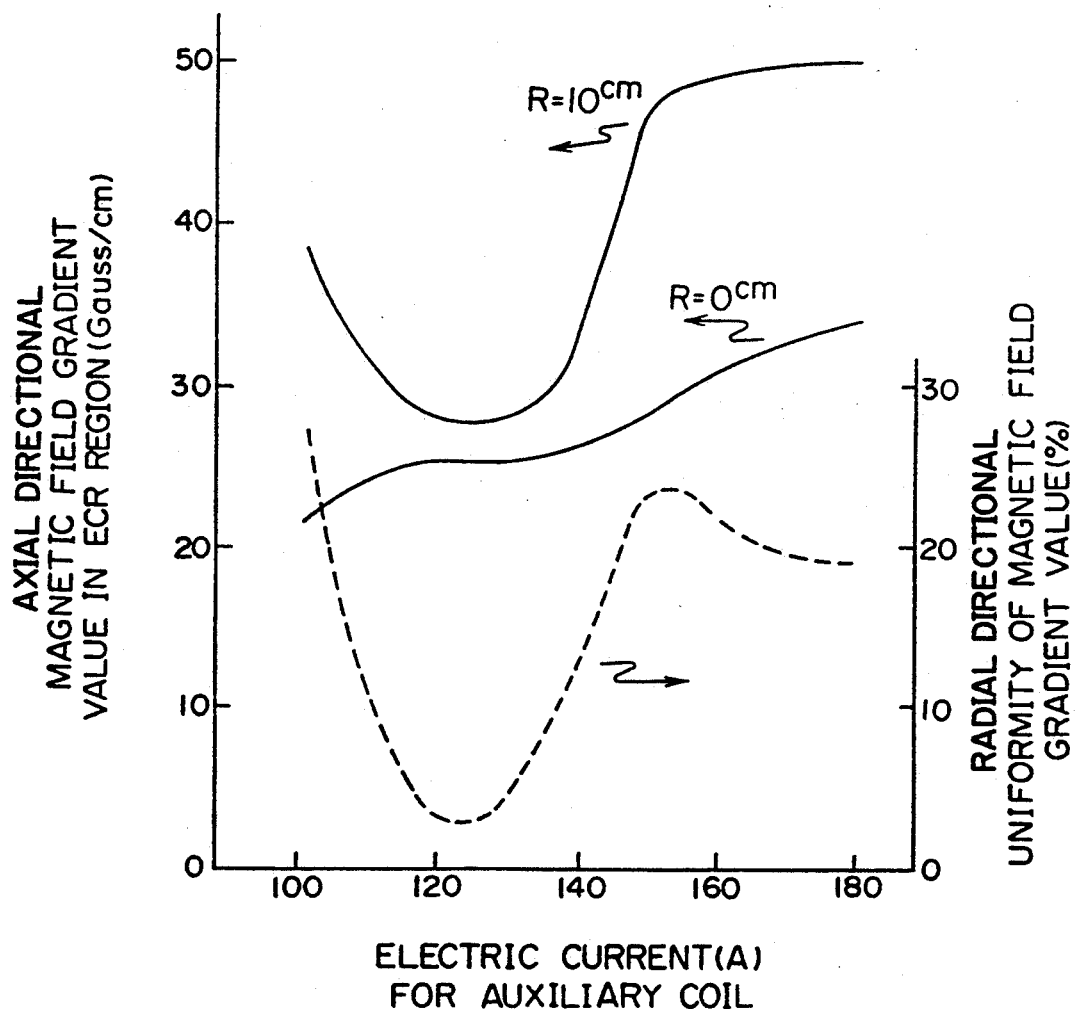
FIG. 2 illustrates the characteristics of a magnetic field generated according to an embodiment of the present invention.

FIG. 2 illustrates the characteristics of the magnetic field generated when the electric current supplied to the auxiliary coil 9 is changed. As shown in FIG. 2, when the electric current supplied to the auxiliary coil 9 is in a range from 110A to 140A, an axial magnetic field gradient of 25 gauss/cm and a magnetic field gradient uniformity of 10% or less are realized, the magnetic field gradient uniformity being that defined above in equation 1. In a case where a magnetic field having a gradient of 50 gauss/cm or less in the axial direction is formed and the difference between the larger and the smaller the aforesaid axial and 10 cm off-axis magnetic field gradients is 10 gauss/cm or less, a high density plasma having satisfactory uniformity is generated. As a result, high processing speed and satisfactory uniformity can be simultaneously realized.

The following table shows the results of Si-etching performed with the plasma reaction apparatus according to this embodiment and with the conventional apparatus.

As described above, according to this embodiment, a magnetic field gradient of 27 gauss/cm and etching uniformity of 3.8% are realized. Therefore, satisfactory uniformity can be realized while maintaining a high Si-etch rate and thus the problem experienced with the conventional apparatus is overcome.

TABLE

| Magnetic Field | Conventional Magnetic Field Condition | Magnetic Field Condition of the Present Invention |
| --- | --- | --- |
| Gradient Value $\frac{dB}{dZ}$ (gauss/cm) | 23 | 27 |
| Si-etch rate (Å/min) | 1500 | 1400 |
| Uniformity of Magnetic Field Gradient (%) | 50 | 3.8 |
| Uniformity of Etch rate (%) | 20 | 3.2 |

Second Embodiment

Although the aforementioned embodiment is arranged in such a manner that the size of the gap B 3 cm, a similar effect can be obtained by making the size of the gap B ¼ to 1 times the axial directional length A of the auxiliary coil 9.

Third Embodiment

Figure 3:
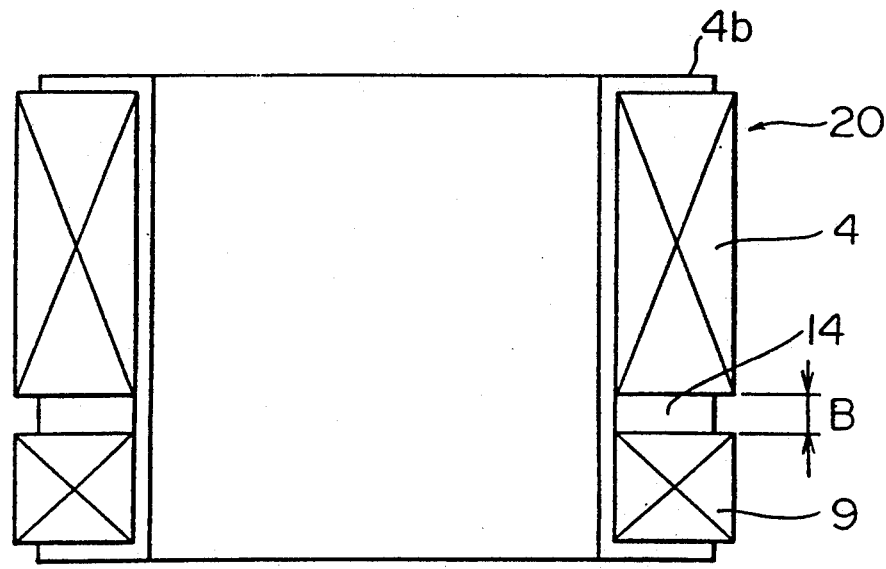
FIG. 3 is a cross sectional view which illustrates a magnetic field generating means according to a third embodiment of the present invention.

The magnetic field generating means 20 according to the aforesaid embodiments has the solenoid coil 4 and the auxiliary coil 9 placed with the gap B between them. However, the necessity of the two coils can be eliminated and the magnetic field generating means 20 may be structured as follows: two coils 4 and 9 are located with a spacer 14 between them to form the gap B on one solenoid coil form 4b as shown in FIG. 3.

Fourth Embodiment

Figure 4:
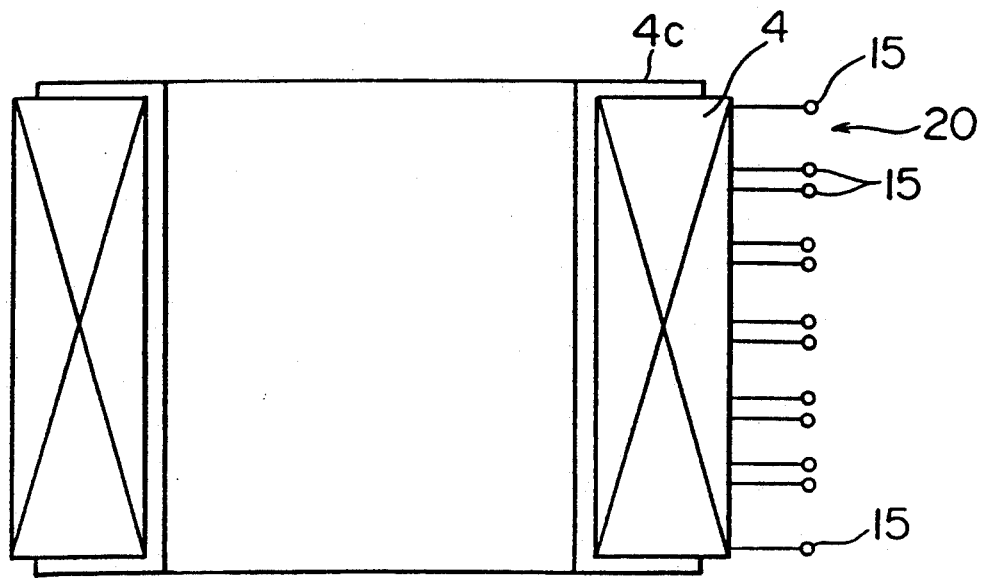
FIG. 4 is a cross sectional view which illustrates a magnetic field generating means according to a fourth embodiment of the present invention.

As shown in FIG. 4, the above-mentioned magnetic field generating means 20 may be structured with a plurality of exciting taps 15 in one solenoid coil 4c. According to the fourth embodiment, an advantage can be obtained in that the effective length of the gap B can be freely chosen by selecting amongst the taps 15.

What is claimed is:

1. A plasma reaction apparatus comprising:
   a reaction chamber for accommodating a semiconductor substrate;
   a waveguide connected to said reaction chamber for introducing microwave energy into said reaction chamber; and
   magnetic field generating means disposed around said reaction chamber and having a central axis for generating a magnetic field having an axial gradient of no more than 50 gauss/cm along the central axis of said magnetic field generating means and a second magnetic field gradient along a direction parallel to the central axis and spaced from the central axis by ten centimeters wherein the difference between the axial and the second magnetic field gradients does not exceed 10 gauss/cm, and for exciting an electronic cyclotron resonance in a plasma produced by the microwave energy for processing a semiconductor substrate in said reaction chamber.

2. The plasma reaction apparatus of claim 1 wherein said magnetic field generating means comprises a solenoid coil and an auxiliary coil spaced from each other by a predetermined gap for forming a mirror magnetic field between said solenoid and auxiliary coils.

3. The plasma reaction apparatus of claim 2 wherein said auxiliary coil has an axial length and the gap is ¼ to one times the axial length of said auxiliary coil.

4. The plasma reaction apparatus of claim 1 wherein said magnetic field generating means comprises a coil form, a spacer mounted on said form, a solenoid coil wound on said form, and an auxiliary coil wound on said form and spaced from said solenoid coil by said spacer.

5. The plasma reaction apparatus of claim 1 wherein said magnetic field generating means includes a solenoid coil having a plurality of exciting taps connected to windings of said solenoid coil for producing a magnetic field that is the same as a magnetic field produced by two coils separated by an adjustable gap.

6. A plasma reaction apparatus comprising:
   a reaction chamber including a gas inlet and a gas outlet for introducing a gas into and exhausting a gas from said reaction chamber;
   a wave guide connected to said reaction chamber for introducing microwave energy into said reaction chamber for producing a plasma in a gas within said reaction chamber; and
   magnetic field generating means disposed surrounding said reaction chamber for producing a magnetic field within said reaction chamber for producing electron cyclotron resonance in a plasma in said reaction chamber, said magnetic field generating means comprising a main solenoid coil, an auxiliary coil proximate and spaced from said main solenoid coil, and a mirror coil remote from said main solenoid coil, said auxiliary coil being disposed intermediate said main solenoid coil and said mirror coil 7. The plasma reaction apparatus of claim 6 including a spacer interposed between and separating said main solenoid coil from said auxiliary coil.

8. The plasma reaction apparatus of claim 6 wherein said main solenoid coil and said auxiliary coil are coaxial relative to a central axis of said reaction chamber, said auxiliary coil has an axial length measured parallel to said central axis, and said main solenoid coil and said auxiliary coil are separated by a distance ranging from one-quarter to one times the axial length of said auxiliary coil.

9. The plasma reaction apparatus of claim 6 wherein said main solenoid and auxiliary coils comprise a common coil winding including a plurality of winding taps for selecting relative lengths of and spacing between said main solenoid coil and said auxiliary coil.

* * * * *